United States Patent
Fujioka

[11] Patent Number: 5,969,551
[45] Date of Patent: Oct. 19, 1999

[54] CLOCK GENERATOR HAVING DLL AND SEMICONDUCTOR DEVICE HAVING CLOCK GENERATOR

[75] Inventor: Shinya Fujioka, Kawasaki, Japan

[73] Assignee: Fujitsu Limited, Kawasaki, Japan

[21] Appl. No.: 08/961,181

[22] Filed: Oct. 30, 1997

[30] Foreign Application Priority Data

May 30, 1997 [JP] Japan .................................. 9-142441

[51] Int. Cl.⁶ .................................................. H03K 5/13
[52] U.S. Cl. .......................... 327/149; 327/158; 327/156
[58] Field of Search ................................. 327/261, 269,
327/270, 271, 284, 149, 150, 153, 158,
159, 161, 156; 331/10

[56] References Cited

U.S. PATENT DOCUMENTS

| | | | |
|---|---|---|---|
| 4,165,490 | 8/1979 | Howe, Jr. et al. ...................... | 327/172 |
| 5,087,829 | 2/1992 | Ishibashi et al. ....................... | 327/152 |
| 5,515,403 | 5/1996 | Sloan et al. ............................. | 375/371 |
| 5,552,726 | 9/1996 | Wichman et al. ...................... | 327/149 |
| 5,710,744 | 1/1998 | Suda ...................................... | 368/120 |

*Primary Examiner*—Kenneth B. Wells
*Assistant Examiner*—Hai L. Nguyen
*Attorney, Agent, or Firm*—Nikaido, Marmelstein, Murray & Oram LLP

[57] ABSTRACT

A clock generator including a DLL occupying a small area and a semiconductor device including the clock generator have been disclosed. In the clock generator for generating a plurality of clocks optimally adjusted in phase for a plurality of objects on the basis of a received clock, the DLL is structured hierarchically. A first DLL of a parent level is used in common and second DLLs of child levels are associated with input signals.

18 Claims, 17 Drawing Sheets

CLOCK GENERATOR HAVING DLL AND SEMICONDUCTOR DEVICE HAVING CLOCK GENERATOR

BACKGROUND OF THE INVENTION

1. Field of the Invention

The present invention relates to a clock generator for generating a plurality of clocks independently adjusted in phase using a received external clock, and to a semiconductor device having the clock generator therein. More particularly, this invention is concerned with a semiconductor device for correcting a time difference of each input data from a data fetching edge of an external clock.

2. Description of the Related Art

In a large-scale semiconductor device system such as a computer using semiconductor devices, each part of the system is designed to operate synchronously with a clock. Input or output of a signal such as a data signal or address signal is synchronous with the clock. Because of a difference in characteristic of an output circuit in a driving-side semiconductor device from another output circuit or a phase difference of an output timing signal, the state transition edge of each output signal becomes different in time from the trailing edge of the clock. Moreover, since the length of a signal line may be different from that of another line or the load on the signal line may be different from that on another line, there arises a difference in transfer time between signals. A time difference of the state transition edge of an input signal received by a receiving-side semiconductor device from the trailing edge of the clock gets larger. During a period during which the time difference occurs, all input signals are uncertain. The period is therefore regarded as an uncertain period during which any input signal cannot be fetched. The time difference in phase between signals is referred to as a skew. The skew depends on the length of or load on a signal line and therefore cannot be nullified.

When a semiconductor device fetches an input signal using a latch, a required setup time and hold time must be set in the latch from the operational viewpoint. A time during which an input signal must be certain is defined before and after the leading edge of a clock. Even if an input signal to be received by a receiving-side semiconductor device has a skew, the input signal must be certain during the setup time and hold time before and after the leading edge of the clock. A period remaining after subtraction of an uncertain period of the input signal from the cycle of the clock is a certain period of the input signal. In a low-speed system, the uncertain period of the input signal is relatively small for the cycle of a clock and therefore does not pose a serious problem. However, in a high-speed system, since the cycle of a clock is very short, the ratio of the uncertain period of an input signal to the cycle of the clock gets relatively large. The certain period diminishes accordingly. The uncertain period therefore poses a serious problem. This may lead to a situation in which a skew restricts the operating speed of a semiconductor device.

For solving this kind of problem, an art in which an input timing adjustment circuit and a re-synchronization circuit are installed for each input signal and all input signals are adjusted to be mutually synchronous is conceivable. The input timing adjustment circuit includes a delay-locked loop (DLL). A delay circuit included in the delay-locked loop includes a delay line having numerous delay elements, each of which introduces a magnitude of delay equivalent to the passage of a signal through one stage, connected in series with one another. When the magnitude of delay per stage is reduced in order to enable precise phase adjustment, a phase must be able to be adjusted by a quantity large enough to cancel a predicted skew. The number of stages of the delay line therefore becomes very large. For this reason, the scale of the delay circuit is large. Moreover, this kind of delay circuit must be installed for each input signal. The whole of a circuit for coping with the skews of the input signals therefore becomes very large in scale. This dominates the area of a chip and becomes a cause for an increase in chip area.

SUMMARY OF THE INVENTION

An object of the present invention is to reduce an area occupied by an anti-skew circuit. However, the present invention is not limited to the anti-skew circuit but may apply to any circuit as long as the circuit includes a DLL.

A clock generator in accordance with the present invention has a DLL structured hierarchically. A first DLL of a parent level is used in common, and second DLLs of child levels are associated with input signals. Since the first DLL can be used in common, the circuit scale can be reduced. Even when a DLL is structured hierarchically, if a DLL of a parent level is installed for each input, a large area is required. The hierarchical structure does not prove effective. The DLL of the parent level must therefore be used in common.

The magnitude of delay introduced in one stage of the first DLL should preferably be larger than those introduced in any one stage of the second DLLs. As mentioned above, when the magnitude of delay introduced in one stage of a delay circuit is made larger, the scale of the delay circuit can be reduced but phase adjustment cannot be carried out precisely. However, when the above hierarchical structure is adopted, the circuit scale can be reduced and adjustment can be carried out precisely.

The above hierarchical structure can be adopted when a skew between a clock and a group of input signals is larger than a skew between input signals because of a difference of the signal path of the clock CLK from the signal path of the group of input signals. The first DLL is used to adjust the skew between the clock and the group of input signals, and each second DLL is used to adjust the skew between input signals.

For using a delay circuit in common, the same delay line may be used, and a clock may be able to be fetched selectively from among stages of the delay line in relation to each object. This idea is implemented in the foregoing hierarchical structure. That is to say, the first DLL is designed to output a plurality of coarsely-adjusted clocks whose magnitudes of delay are adjusted independently. It is judged whether or not the phase differences of all the plurality of clocks from an optimal clock fall within a given range of phase differences. If the phase differences do not fall within the given range of phase differences, it is judged whether the clocks are leading or lagging. Based on the results of the judgment, coarsely-adjusted clocks whose magnitudes of delay are adjusted independently are output to the second DLLs. A range of a received clock to be adjusted relative to each object is a sum of a range thereof to be adjusted by the first DLL and a range thereof to be adjusted by each second DLL. Moreover, the range of a clock to be adjusted relative to each object is independent object by object. In other words, when a skew between objects falls within the sum of a range of a clock to be adjusted by the first DLL and a range thereof to be adjusted by each second DLL, the skew can be adjusted.

The first DLL is therefore composed of a delay circuit for delaying a received clock stepwise, and a row of switches that may or may not switch the stages of the delay circuit over to the second DLLs so as to route the outputs of the stages to the second DLLs. Based on the results of judgment made on the clocks, a switch to be brought to conduction is selected from the row of switches.

When the first and second DLLs in the clock generator are used to judge if the phase of a clock is optimal, an object should preferably be brought to a state suitable for such judgment. However, when an object is brought to such a state, a normal operation cannot be carried out. A calibration mode in which the magnitudes of delay introduced by the first and second DLLs are adjusted is therefore defined. After the calibration mode is completed, the first and second DLLs should preferably maintain the magnitudes of delay attained at the completion of the calibration mode. For this purpose, the first and second DLLs each should preferably include a latch for holding an adjusted magnitude of delay.

Furthermore, a known semiconductor device comprises a clock distribution circuit for distributing an internal clock generated on the basis of an externally input received clock, and local clock generators for generating a plurality of local clocks on the basis of internal clocks supplied from the clock distribution circuit. When the clock generator of the present invention is adapted to the local clock generators, the scale of the local clock generators can be reduced. In particular, the present invention should preferably apply to a local clock generator for generating a clock used to fetch input data to be input to a semiconductor device. This is because there is a skew between input signals or between a local clock and a group of input signals, and the skew becomes an obstacle to an increase in operating speed of the semiconductor device.

Moreover, there is a skew between input signals fetched synchronously with a plurality of thus generated local clocks. It is therefore preferable to include re-synchronization circuits for re-synchronizing input data items fetched synchronously with the edges of the plurality of local clocks with a common re-synchronization clock.

A clock distribution circuit for distributing an internal clock to local clock generators should preferably be designed so that a skew will not occur between distributed internal clocks. The clock distribution circuit is designed to be a clock distribution circuit formed with an H-shaped tree wiring in which the lengths of lines leading to distribution destinations and the loads thereon are mutually identical, or a clock distribution circuit including incoming and outgoing lines over which an internal clock is transferred to go out and back and local clock buffers for receiving incoming and outgoing internal clocks and generating a corrected internal clock that is in phase with a mean of the incoming and outgoing internal clocks.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

Before proceeding to a detailed description of the preferred embodiments of the present invention, a prior art semiconductor device system including clock-synchronous devices will be described to allow a better understanding of the differences between the present invention and the prior art.

Figure 1A:
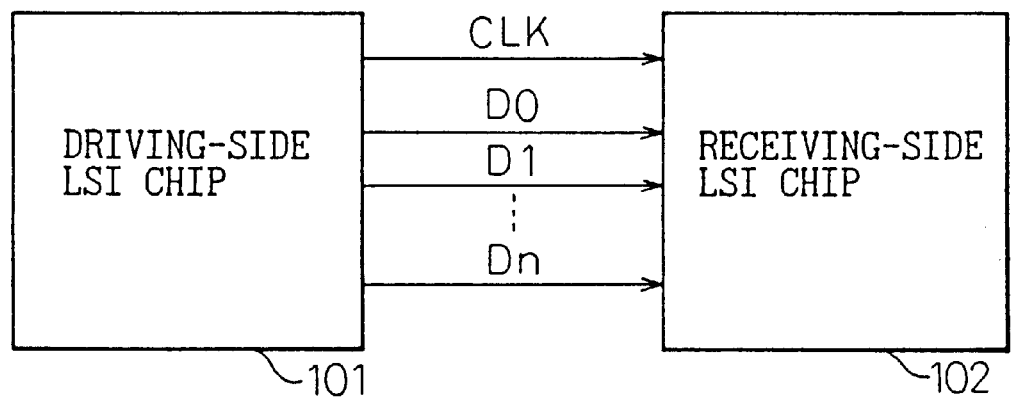
FIG. 1A is a diagram showing the basic configuration of a clock synchronization system.
Figure 1B:
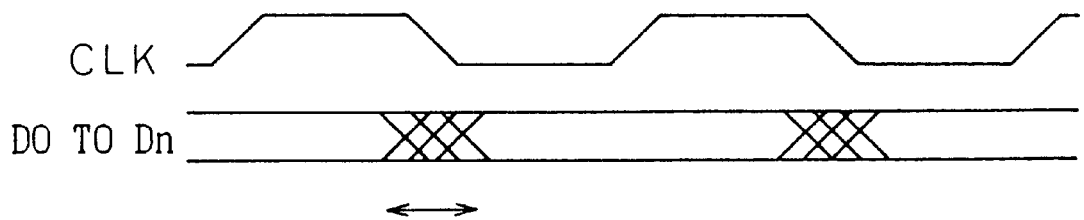
FIG. 1B is a diagram showing the operations of the clock synchronization system.
Figure 1B:
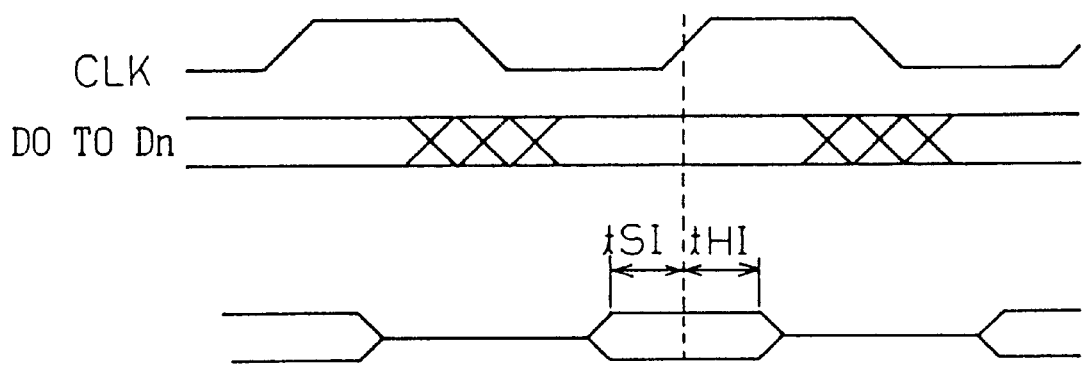

FIGS. 1A and 1B are diagrams showing the basic configuration and operations of a system composed of clock-synchronous semiconductor devices. As shown in FIG. 1A, this system comprises a driving-side semiconductor device 101 for transmitting signals and a receiving-side semiconductor device 102 for receiving the signals. The driving-side semiconductor device 101 outputs a clock CLK as well as output signals D0 to Dn synchronously with the clock CLK. The receiving-side semiconductor device 102 fetches signals sent from the driving-side semiconductor device 101 as input signals D0 to Dn synchronously with the received clock CLK. In FIG. 1A, the number of receiving-side semiconductor devices 102 is one. A plurality of receiving-side semiconductor devices 102 may be present. Moreover, semiconductor devices constituting a semiconductor device system often transmit and receive signals to and from one another. In such a case, the semiconductor devices may act as a driving side or receiving side.

FIG. 1B is a diagram showing the clock CLK and signals on a bus in the semiconductor device system shown in FIG. 1A. The clock CLK and output signals D0 to Dn to be output from a driving side are shown in the upper part of FIG. 1B, while the clock CLK and input signals D0 to Dn to be received by a receiving side are shown in the lower part thereof. The driving-side semiconductor device 101 causes the output signals D0 to Dn to make a state transition synchronously with the fall of the clock CLK. The receiving-side semiconductor device 102 fetches the signals D0 to Dn as the input signals D0 to Dn synchronously with the rise of the fetched clock CLK.

In FIG. 1B, the output signal make a state transition synchronously with the fall of the clock CLK and are received as the input signals synchronously with the rise of the clock CLK. The output signals may make a state transition with phase shifts from the fall or rise of the clock CLK, and be fetched into a semiconductor device. For brevity's sake, the description will proceed on the assumption that the input signals shall make a state transition synchronously with the fall of the clock CLK and be fetched synchronously with the rise of the clock CLK. However, the present invention is not limited to this mode.

As shown in FIG. 1B, the driving-side semiconductor device 101 causes the output signals D0 to Dn to make a state transition synchronously with the fall of the output clock CLK. In reality, the state-transition edges of the output signals are different in time from the fall of the clock CLK because of differences in characteristics among output circuits or phase differences among output timing signals. Signal lines routed from the driving-side semiconductor device 101 to the receiving-side semiconductor device 102 have different lengths or have different loads connected thereon. The time required for a signal to be transferred from the driving-side semiconductor device 101 to the receiving-side semiconductor device 102 becomes therefore different from signal to signal. Consequently, the time differences of the state-transition edges of the input signals received by the receiving-side semiconductor device 102 from the trailing edge of the clock CLK become larger as illustrated. In the period during which the time differences occur, all the input signals are uncertain. The period is therefore regarded as an uncertain period during which no input signal can be fetched. A time difference between signals is referred to as a skew.

When a semiconductor device uses a latch to fetch an input signal, a required setup time tSI and hold time tHI must be set in the latch from the operational viewpoint. A time for which the input signal must be certain is thus defined before and after the leading edge of the clock CLK. Even when an input signal to be received by the receiving-side semiconductor device 102 has a skew, the input signal must be certain before and after the leading edge of the clock CLK or during the setup time tSI and hold time tHI. A period of time remaining after subtraction of the uncertain period of the input signal from the cycle of the clock is a certain period of the input signal.

Figure 2:
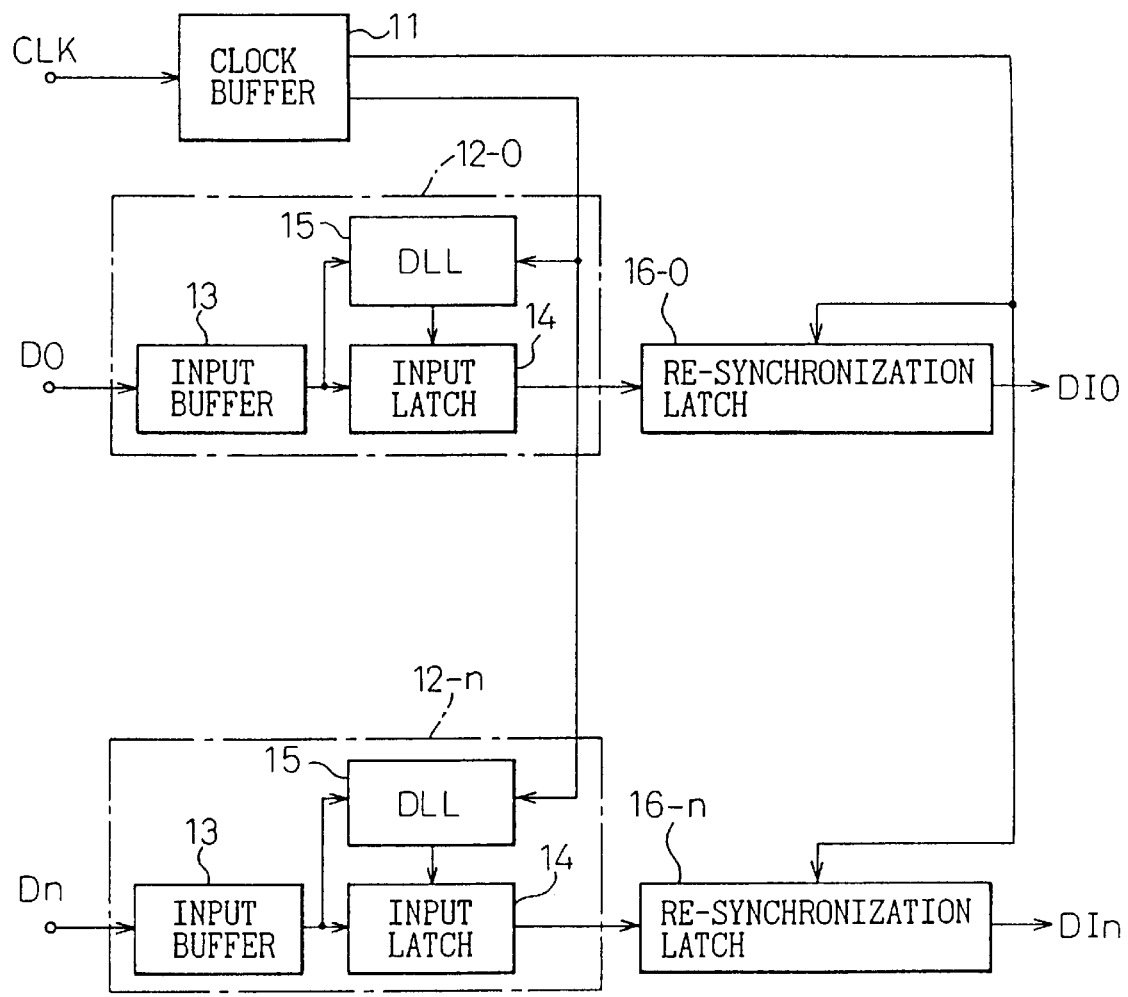
FIG. 2 is a diagram showing the circuitry of a prior art for coping with a skew of an input signal.

FIG. 2 is a diagram showing a configuration for coping with a skew of an input signal. As shown in FIG. 2, input signal fetch timing adjustment circuits 12-0 to 12-n are associated with input signals D0 to Dn. Each input signal fetch timing adjustment circuit comprises an input buffer 13, input latch 14, delay-locked loop (DLL) 15. The DLL 15 comprises a delay circuit capable of delaying a clock output from the clock buffer 11 and changing a magnitude of delay stepwise, and a phase comparator for judging whether or not the phase of a delayed clock is optimal for fetching an input signal output from the input buffer 13. The DLL 15 adjusts the magnitude of delay until the phase of the delayed clock relative to an input signal becomes optimal. The DLL 15 therefore outputs a clock whose phase is optimal for fetching an input signal. An input latch 14 latches an input signal output from the input buffer 13 synchronously with the clock. As illustrated, since the input signal fetch timing adjustment circuits are associated with input signals, the input signals are fetched according to optimal timing irrespective of whether or not they have a skew.

The fetch timing of each input latch 14 is adjusted independently of another. The input signals fetched as mentioned above are therefore mutually out of phase. A problem arises when the input signals are processed internally simultaneously. For overcoming this problem, re-synchronization latches 16-0 to 16-n are included for phasing the input signals that are output from the input latches 14 and out of phase. Owing to this configuration, the input signals can be fetched according to optimal timing and output as input signals that are mutually in phase.

As mentioned above, the delay circuit included in the DLL shown in FIG. 2 is large in scale. Since the delay circuit is included for each input signal, the whole circuit for coping with skews of input signals shown in FIG. 2 is very large in scale. This greatly dominates the area of a chip and becomes a cause for an increase in chip area.

Figure 3:
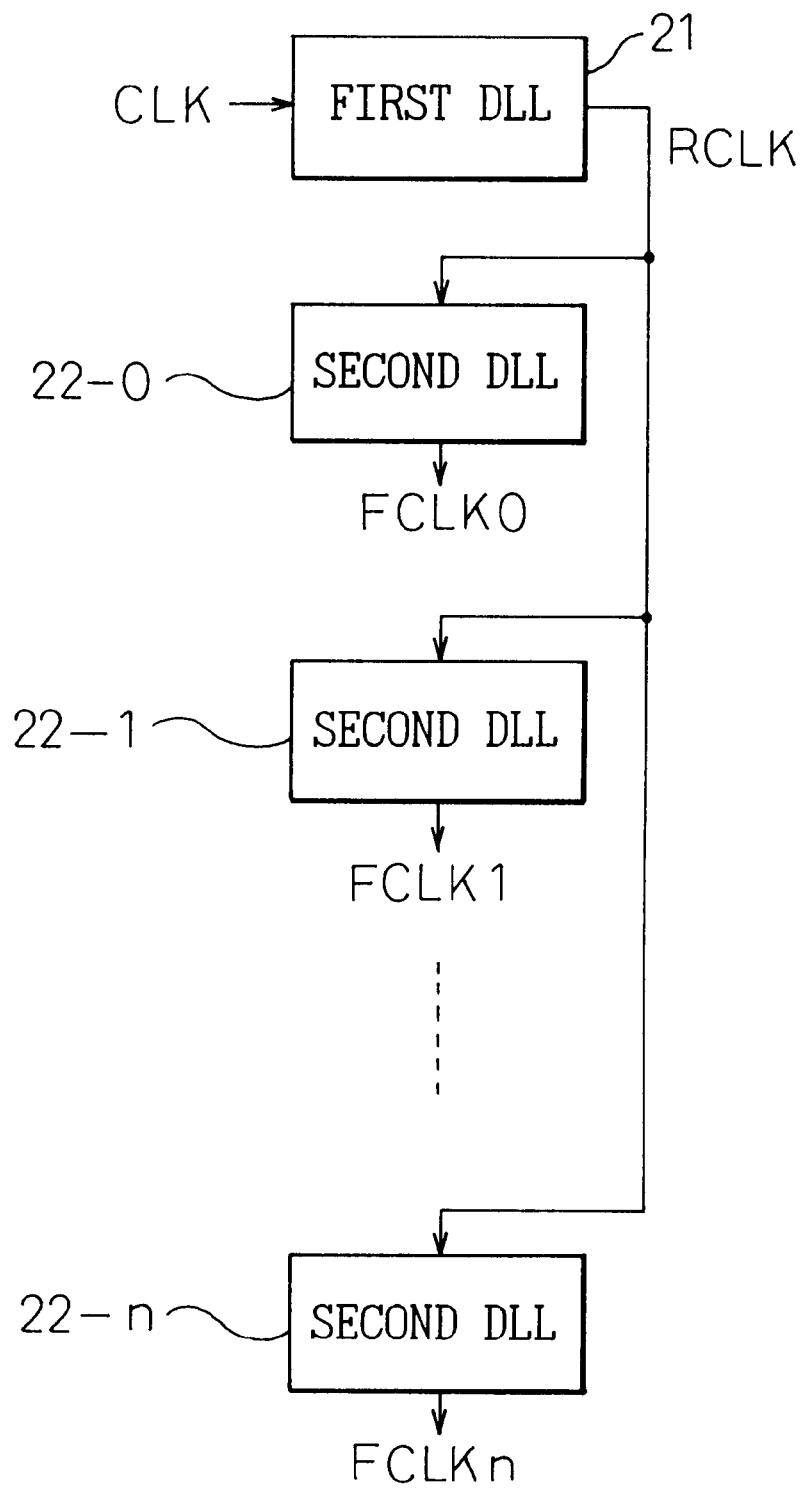
FIG. 3 is a diagram showing the basic configuration of a clock generator in accordance with the present invention.

FIG. 3 is a diagram showing the basic configuration of a clock generator in accordance with the present invention. As shown in FIG. 3, the clock generator of the present invention is a clock generator for generating a plurality of clocks FCLK0 to FCLKn whose phases are adjusted optimally for a plurality of objects on the basis of a received clock CLK. The clock generator comprises a first DLL 21 for adjusting the phase of the received clock by adjusting the magnitude of delay, by which the received clock CLK is delayed, stepwise, and outputting a coarsely-adjusted clock RCLK, and a plurality of second DLLs 22-0 to 22-n for adjusting the phase of the coarsely-adjusted clock RCLK by adjusting the magnitude of delay, by which the coarsely-adjusted clock RCLK is delayed, stepwise, and outputting a plurality of clocks FCLK0 to FCLKn. The first DLL 21 judges whether or not the phase difference of at least one of the plurality of clocks from an optimal clock falls within a given range of phase differences. If the phase difference does not fall within the given range of phase differences, the first DLL 21 judges whether the clock is leading or lagging. Based on the result of judgment, a magnitude of phase adjustment is changed. The second DLLs 22-0 to 22-n judge whether or not the plurality of clocks FCLK0 to FCLKn are leading or lagging behind the optimal clock. Based on the results of judgment, the magnitudes of phase adjustment are changed.

An embodiment in which the present invention is adapted to a part of a synchronous dynamic random access memory (SDRAM) for fetching input signals will be described below. The present invention is not limited to this part but may be adapted to an output part of the SDRAM for outputting output signals synchronously with a clock. The present invention can be adapted to any other device as long as the device uses a DLL for generating a clock, of which the phase relative to a signal is optimal, for each signal.

Figure 4:
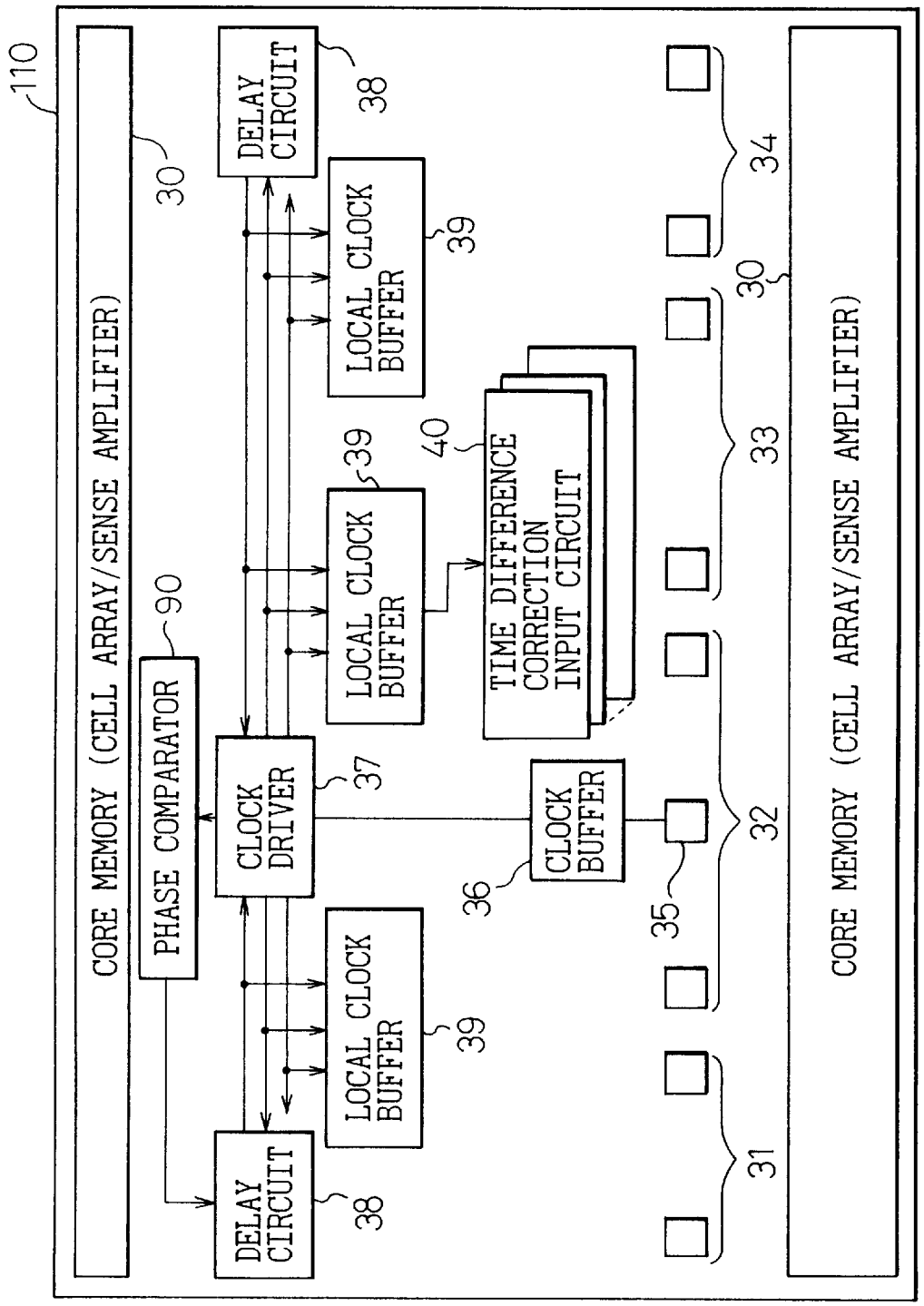
FIG. 4 is a diagram showing the overall configuration of a synchronous DRAM of the first embodiment.

FIG. 4 is a diagram showing the overall configuration of an SDRAM of the first embodiment of the present invention. As illustrated, a core memory 30 composed of a cell array, a sense amplifier, and the like is located along a long side of a chip, and peripheral circuits including an address buffer and decoder are located in the center thereof. Pads 31 to 35 are arranged in a row in the middle of the peripheral circuits. The peripheral circuits are arranged across the row of pads. The pads are grouped into data signal pads 31 and 34 located on both ends of the row, control signal pads 32, and address signal pads 33. A clock pad 35 is included in the control signal pads 32. An external clock applied to the clock pad 35 is input to a clock buffer 36 and fetched into the chip. An internal clock output from the clock buffer 36 is supplied to the whole chip by a clock distribution circuit.

The clock distribution circuit should preferably supply internal clocks CLK that are in phase to the components of the chip. As the clock distribution circuit, an H-shaped tree type clock distribution circuit that will be described later is known. In the first embodiment, a new clock distribution circuit is employed. The clock distribution circuit consists of an outgoing clock signal line running from a clock driver 37 throughout the chip, and delay circuits 38 terminating the signal line. An incoming clock signal line runs from the delay circuits 38 in parallel with the outgoing clock signal line. Clocks supplied to the delay circuits 38 over the outgoing clock signal line are delayed by a certain magnitude, and then applied to the incoming clock signal line. Herein, a main clock signal line is laid in parallel with the outgoing and incoming clock signal lines. Local clock buffers 39 are arranged along the clock signal lines, and each supply an internal clock to the peripheral areas. The phases of middle points of an outgoing clock propagating along the outgoing clock signal line and of an incoming clock propagating along the incoming clock signal line are the same at whichever point on the clock signal lines the phases are checked. Each local clock buffer 39 therefore delays an internal clock supplied over the main clock signal line by a half of a phase difference between the outgoing clock and incoming clock, and thus generates and outputs an internal clock CLK. Without the delay circuits 38, since the phase difference between the outgoing clock and incoming clock observed near a terminal is small, it is hard to detect and correct the phase difference accurately. The delay circuits 38 are therefore included for introducing a certain phase difference. Moreover, since the internal clock has a very high frequency, when the length of a signal line gets longer, it becomes harder to identify phases of clocks to be compared. A clock having a long cycle is transferred over the outgoing clock signal line and incoming clock signal line so that a phase difference can be detected. The internal clock is transferred over the main clock signal.

As mentioned above, the local clock buffers 39 connected over the left and right clock signal lines generate internal clocks CLK that are in phase. If the left signal lines and right signal lines are different in length or load, the internal clocks CLK generated by the left and right local clock buffers 39 are not always in phase. A phase comparator 90 is therefore located near the clock driver 37. The phase comparator 90 compares the phases of incoming clocks propagating over the incoming clock signal line, and adjusts the magnitude of delay introduced by one delay circuit (herein, the left delay circuit) 38 so that the right and left incoming clocks will be in phase. Thus, the internal clocks CLK generated by the left and right local clock buffers 39 are in phase.

As mentioned above, in the first embodiment, the local clock buffers 39 output internal clocks CLK that are in phase irrespective of the location of a local clock buffer. The internal clocks CLK output from the local clock buffers 39 are supplied to time difference correction input circuits 40. In the first embodiment, the time difference correction input circuits 40 each include a latch for fetching an input signal and generate a local clock for defining the timing of fetching an input signal. To some components inside the chip, the local clock buffers 39 may supply the internal clocks directly.

As mentioned previously, an input signal has a skew relative to a clock, and input signals have a skew between them. Since the internal clocks are distributed as mentioned above, the internal clocks CLK output from the local clock buffers are in phase. Since a signal path from a clock pad through the clock buffer 36 to the clock driver 37 is largely different from any other path of an input signal, a skew between a group of input signals and an internal clock is generally larger than a skew between input signals. For fetching such input signals into the chip, the phase of a local clock to be supplied to a latch for fetching each input signal relative to each input signal must be optimized. The time difference correction input circuits 40 each generate a local clock optimal for fetching each input signal using an internal clock CLK.

Figure 5:
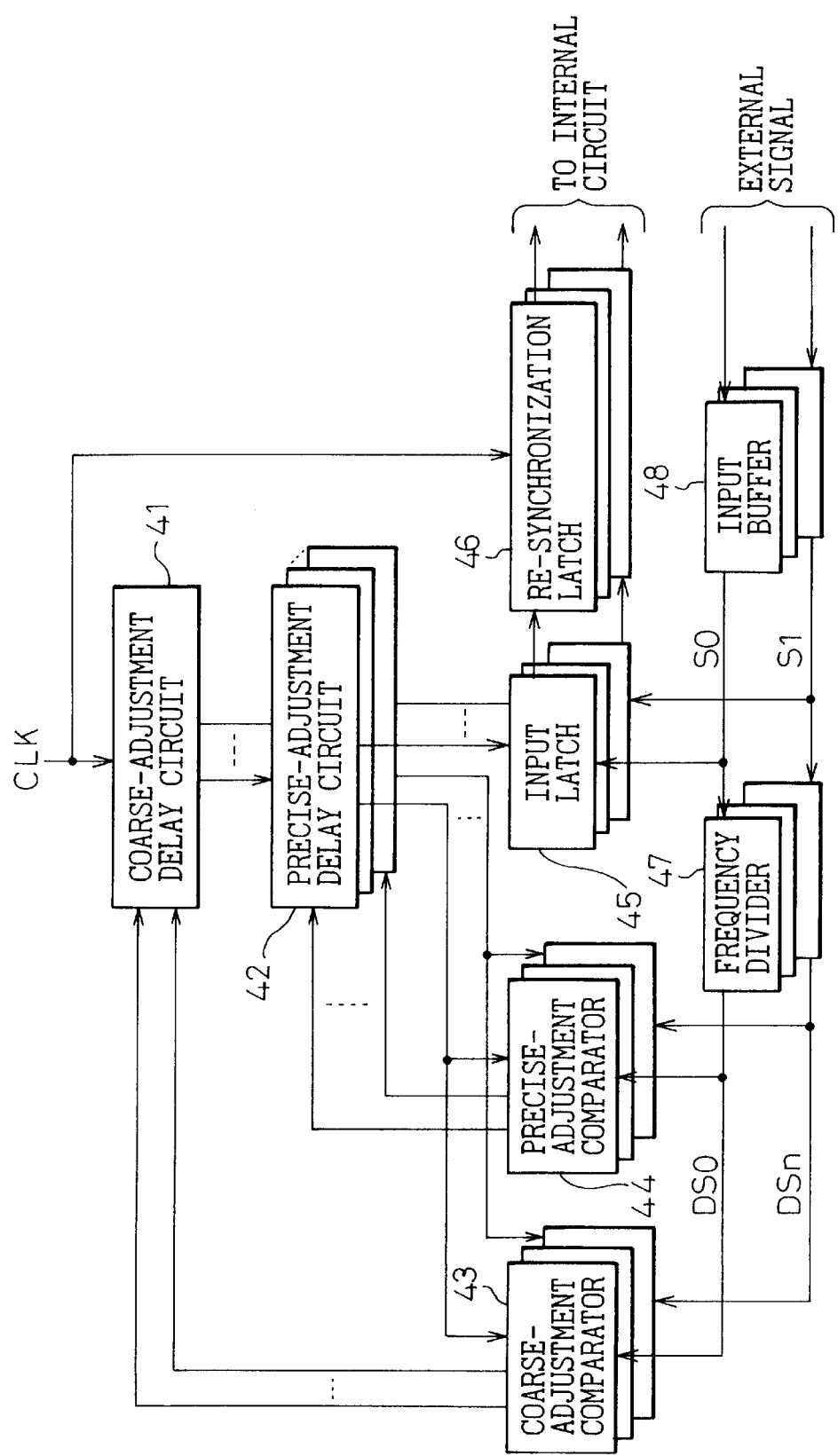
FIG. 5 is a block diagram showing the configuration of a time difference correction input circuit in the first embodiment.

FIG. 5 is a block circuit showing the configuration of a time difference correction input circuit 40. As illustrated, the time difference correction input circuit 40 comprises a coarse-adjustment delay circuit 41 for delaying an internal clock CLK supplied from a local clock buffer 39 by a selected magnitude of delay, precise-adjustment delay circuits 42 for delaying a coarsely delayed clock output from the coarse-adjustment delay circuit 41 by a selected magnitude of delay, coarse-adjustment comparators 43 and precise-adjustment comparators 44 for comparing in phase input signals, which are input from input buffers 48 and subjected to frequency division by frequency dividers 47, with local clocks output from the precise-adjustment delay circuits 42, and judging whether the phases of the local clocks relative to the input signals are optimal, input latches 45 for latching and fetching input signals output from the input buffers 48 responsively to the local clocks output from the precise-adjustment delay circuits 42, and re-synchronization latches 46 for latching the outputs of the input latches 45 responsively to the internal clock CLK and synchronizes in phase the input signals with the internal clock CLK. The frequency dividers are included for proper comparison. As shown in FIG. 5, the numbers of the precise-adjustment delay circuits 42, coarse-adjustment comparators 43, precise-adjustment comparators 44, input latches 45, re-synchronization latches 46, frequency dividers 47, and input buffers 48 are the same as the number of input signals. However, only one coarse-adjustment delay circuit 41 is included to be used in common among the input signals. The coarse-adjustment delay circuit 41 and coarse-adjustment comparators 43 constitute a coarse-adjustment DLL, and the precise-adjustment delay circuits 42 and precision comparators 44 constitute a precise-adjustment DLL. As is apparent from the comparison with FIG. 2, the circuit of this embodiment includes the components similar to the ones of the circuit of the prior art shown in FIG. 2. A difference from the prior art lies in a point that the DLL is composed of the coarse-adjustment DLL and precise-adjustment DLL. Those components that are different from the prior art, and the frequency dividers, will be described below.

Figure 6:
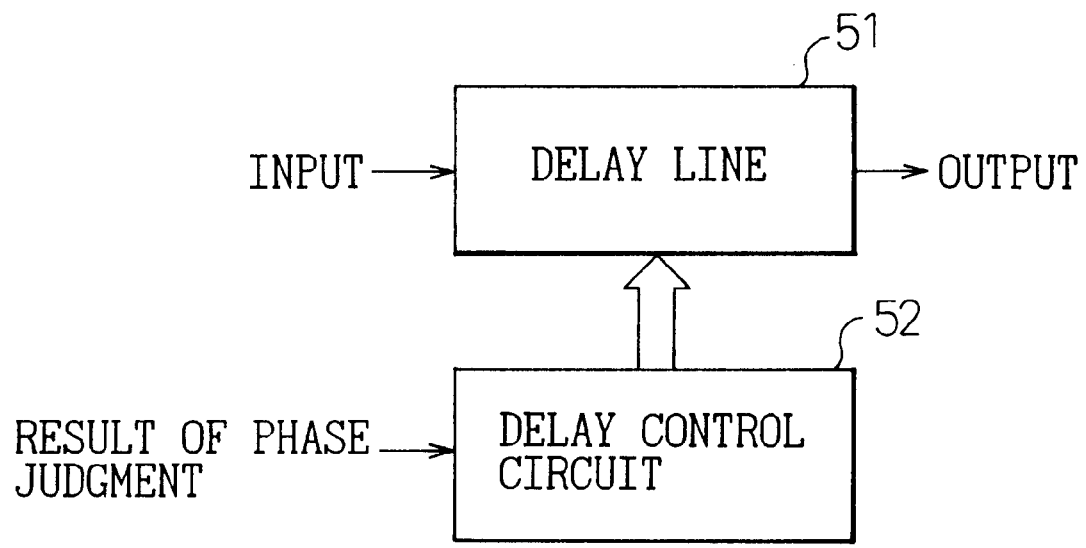
FIG. 6 is a block diagram showing the configuration of a delay circuit.

The coarse-adjustment delay circuit 41 and precise-adjustment delay circuits 42 have the basic configuration shown in FIG. 6. Each delay circuit is composed of a delay line 51 and delay control circuit 52. As mentioned above, a phase comparator is combined with these components in order to constitute a DLL. The DLL will be described briefly. The delay line 51 has the same kind of delay elements connected in series with one another, and makes it possible to select a magnitude of delay by selecting a stage from which an output is fetched. A stage from which an output is fetched is determined with control signals sent from the delay control circuit 52. The phase comparator compares in phase an input signal with a clock delayed by the delay line 51, and judges if the phase difference falls within a given range. If the phase difference does not fall within the given range, it is judged whether the clock is leading or lagging behind the input signal. Based on the result of judgment, the delay control circuit 52 maintains the magnitude of delay set in the delay line 51, or increase or decreases it. By repeating this sequence, the phase difference between the clock and input signal falls within a given range.

Figure 7:
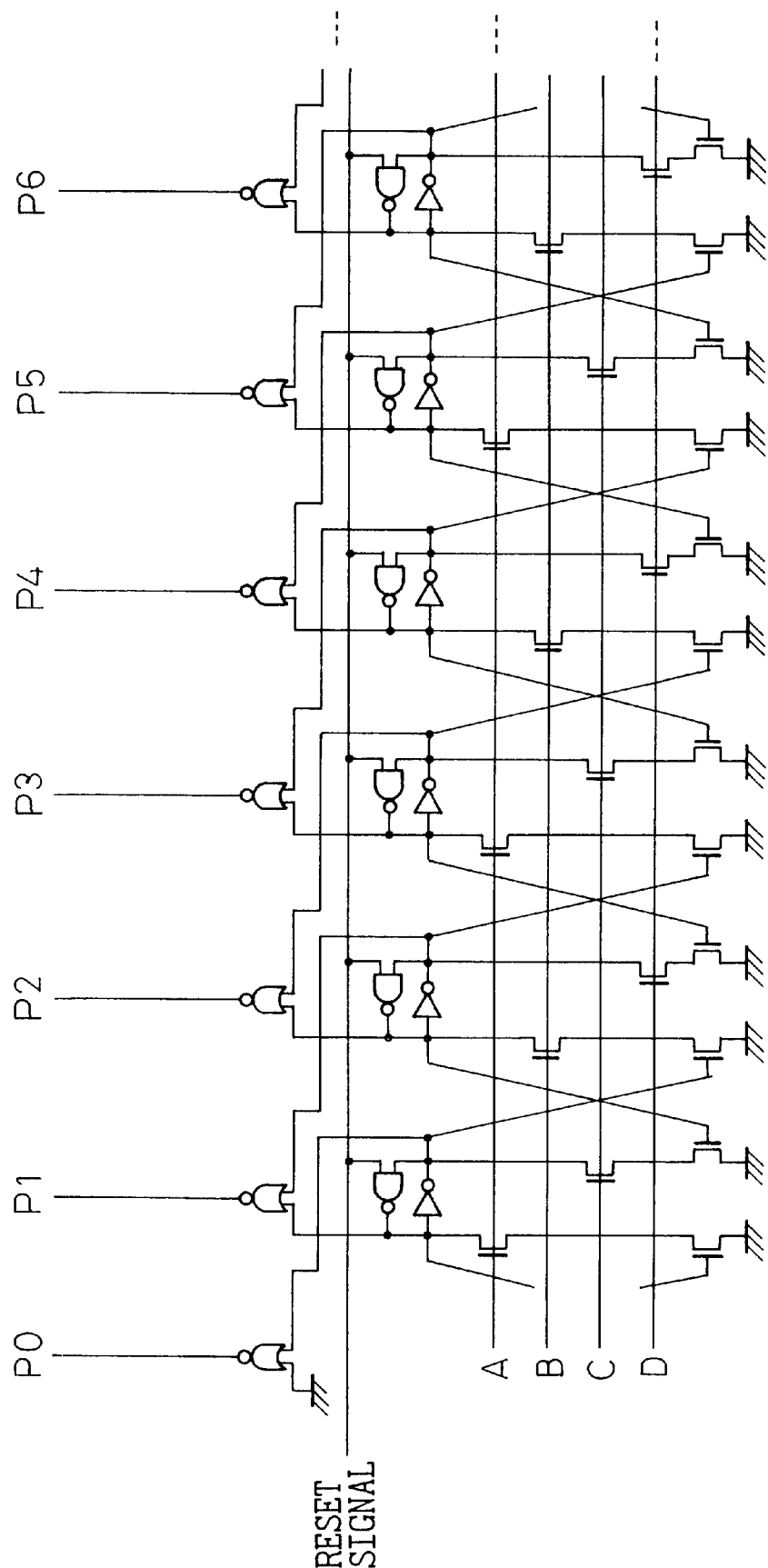
FIG. 7 is a diagram showing the configuration of a delay control circuit in the first embodiment.
Figure 8:
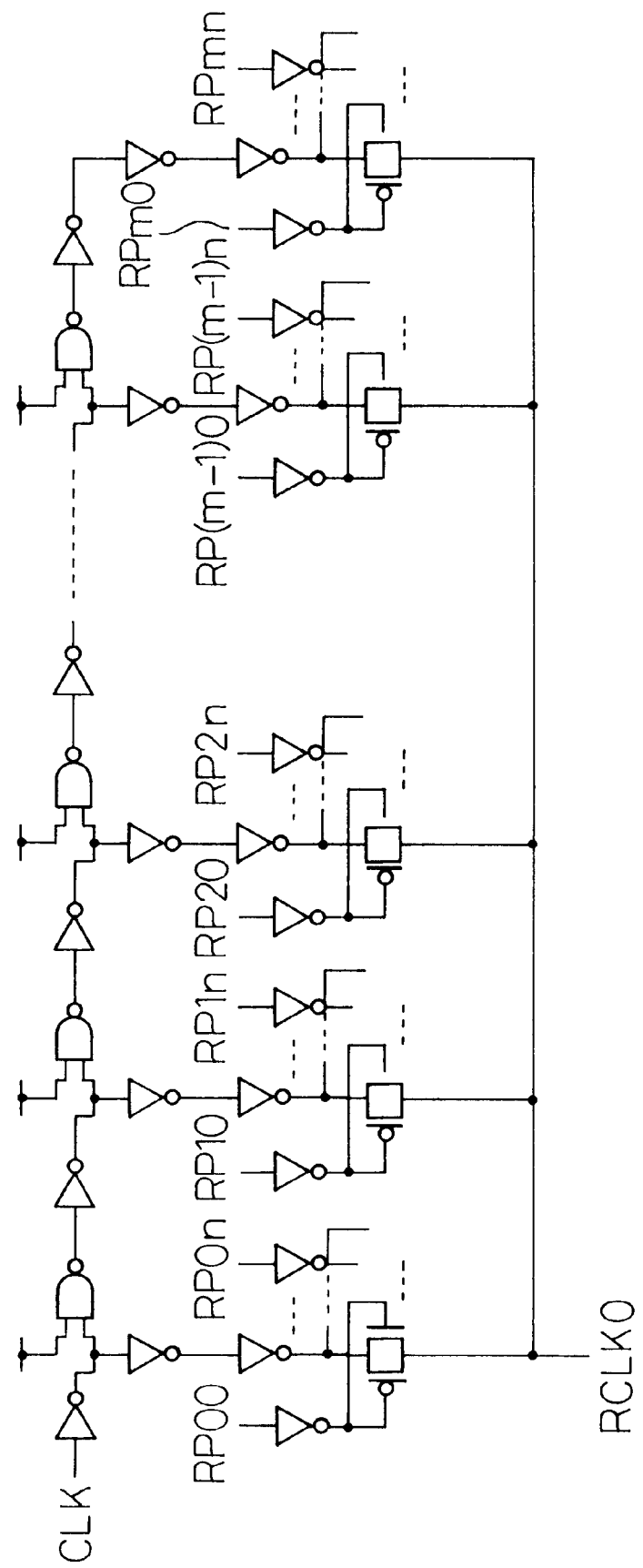
FIG. 8 is a diagram showing a delay line in a coarse-adjustment DLL in the first embodiment.
Figure 9:
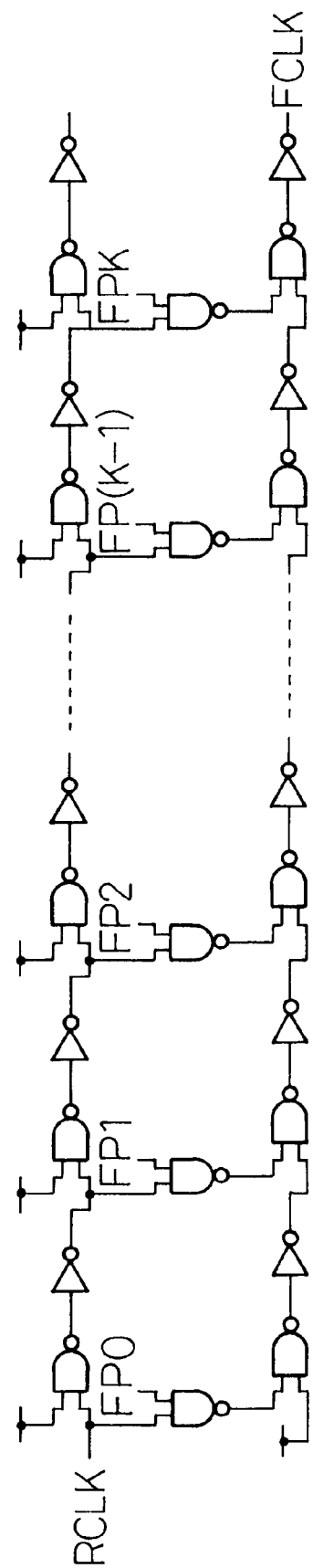
FIG. 9 is a diagram showing a delay line in a precise-adjustment DLL in the first embodiment.
Figure 12:
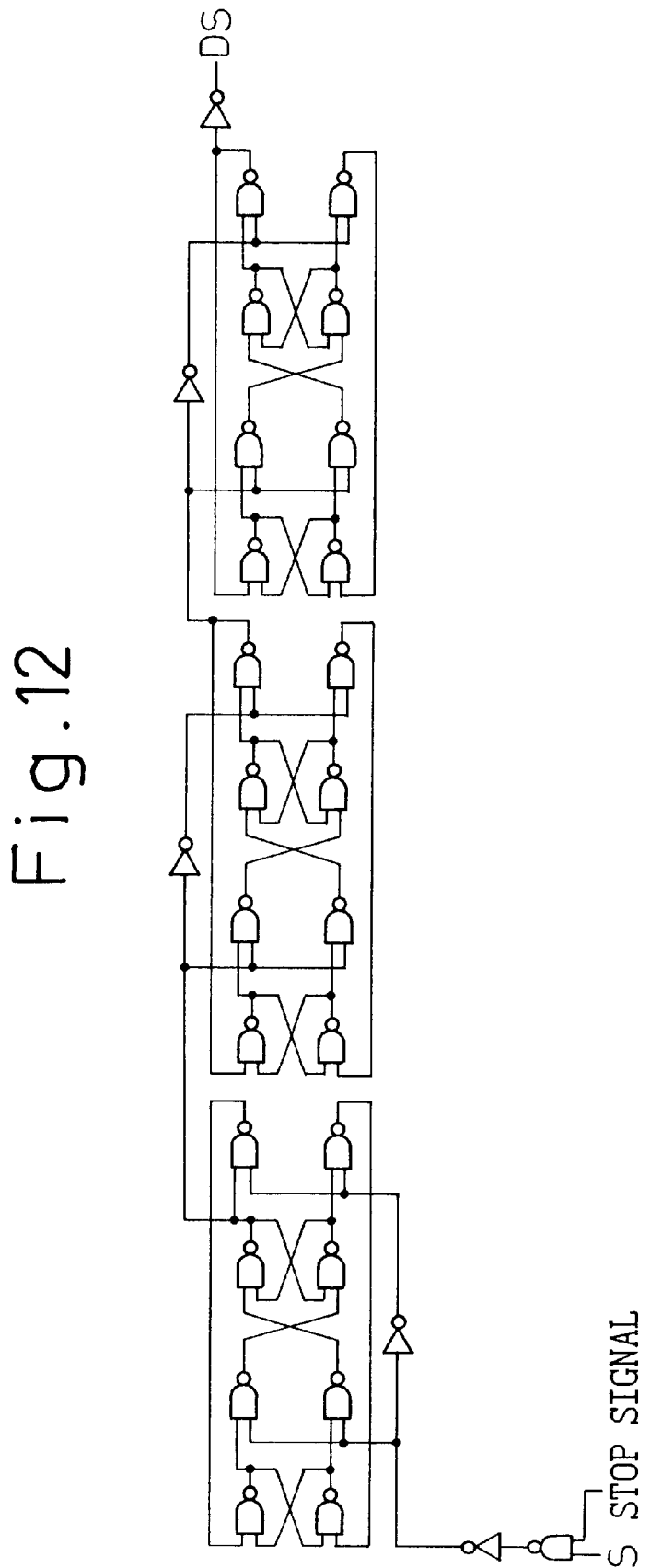
FIG. 12 is a diagram showing a frequency divider in the first embodiment.

FIG. 7 shows the configuration of a delay control circuit included in each of the coarse-adjustment delay circuit 41 and precise-adjustment delay circuits 42, FIG. 8 shows the configuration of a delay line included in the coarse-adjustment delay circuit 41, FIG. 9 shows the configuration of a delay line included in each of the precise-adjustment delay circuits 42, and FIG. 12 shows the configuration of each of the frequency dividers 47.

FIG. 7 shows part of the delay control circuit. Control signals P0 to P6 alone are output. In reality, the same circuit is connected repeatedly so that the same number of control signals as the number of stages of a delay line can be output. The delay control circuit drives only one of output control signals to high and the other control signals to low. With the position of a high-level output, a selected position of the delay line specifying a magnitude of delay is determined. The delay control circuit shifts the position of a high-level output according to signals A to D indicating the result of a judgment made by the phase comparator. When signals A and B go high alternately, the position of a high-level output is shifted rightward. When signals C and D go high alternately, the position of a high-level output is shifted leftward. When a reset signal is input, an output P0 of the first stage is driven high. The same number of this kind of delay control circuits as the number of input signals are included in each of the coarse-adjustment delay circuit 41 and precise-adjustment delay circuits 42. A further description will be omitted. The control signals output from the delay control circuit shown in FIG. 7 remain unchanged when the result of judgment indicated by signals A to D is that the present magnitude of delay will be maintained. In this case, the frequency dividers that will be described later are halted so that phase comparison will not be carried out. Thus, the control signals output from the delay control circuit are maintained. For maintaining the output control signals, there is a method of including latch gates for passing the control signals normally and for latching and holding the control signals when the frequency dividers are halted.

As shown in FIG. 8, a delay line in the coarse-adjustment delay circuit 41 has numerous delay elements, which are grouped into stages each composed of an inverter and NAND gate, connected in series with one another. An output of an inverter in each stage is fetched through a transfer gate. The magnitude of a delay varies depending on from which stage an output is fetched. The same number of transfer gates as the number of input signals are included to be connected to the output terminals of the inverters in the stages. The output terminals of the transfer gates in the stages associated with the input signals are connected in common, and the outputs of the transfer gates are input to associated delay lines in the precise-adjustment delay circuits 42. The transfer gates in the stages associated with the input signals are controlled by output signals of an associated control circuit; RP00, RP0n, etc., RPm0, and RPmn. As mentioned above, one of the output signals of the control circuit is driven high. A transfer gate to which the high-level signal is applied conducts, whereby a coarsely-delayed clock RCLK is output from the stage. Thus, the delay line in the coarse-adjustment DLL 41 in the first embodiment is used in common among input signals. Although a plurality of input signals are supplied, only one delay line is included. The circuit scale can be reduced accordingly. For example, as far as the circuit shown in FIG. 8 is concerned, two circuit elements can be eliminated per stage. Furthermore, some circuit elements can be used in common. The number of circuit elements can be reduced.

As shown in FIG. 9, each of the precise-adjustment delay circuits 42 includes two delay lines having numerous delay elements, which are grouped into stages each composed of an inverter and NAND gate, connected in series with one another. Intermediate NAND gates are placed between the two delay lines to be associated with the stages of the delay lines. An output of each upper inverter is input to an intermediate NAND gate, and an output of the NAND gate is input to a lower NAND gate. An output of a DLL control circuit included in a precise-adjustment DLL is input to the other input terminal of each intermediate NAND gate. Only one intermediate NAND gate transfers a clock output from an upper inverter to a lower NAND gate. The outputs of the other intermediate NAND gates are fixed to high. In other words, a clock propagating along the upper delay line is transferred to the lower delay line through an intermediate NAND gate to which a high-level output of a DLL control circuit is applied, propagates along the lower delay line, and then is supplied as a local clock FCLK. On the upper delay line, an output of an inverter is input to a NAND gate in the next stage and also input to an intermediate NAND gate. On the lower delay line, an output of an inverter is input to a NAND gate in the next stage. The load imposed on an inverter on the lower delay line is smaller. The speed at which a clock is transferred over the lower delay line is therefore a bit higher. A difference in transfer speed between the upper delay line and lower delay line is equal to the magnitude of delay introduced in one stage. The precise-adjustment delay line is required to introduce a very small magnitude of delay per stage. The above circuitry is therefore employed.

Figure 10:
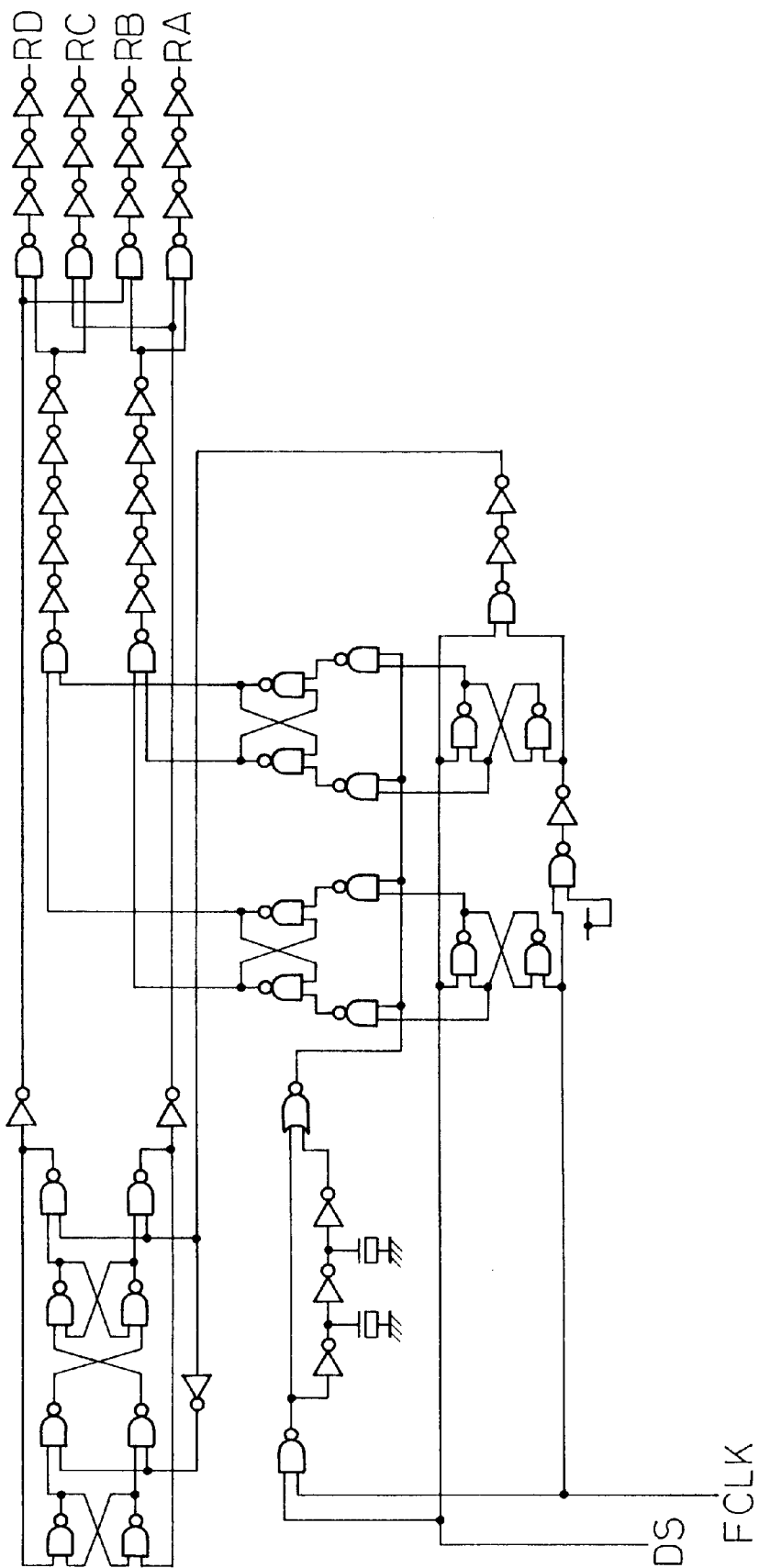
FIG. 10 is a diagram showing a coarse-adjustment comparator in the first embodiment.

A coarse-adjustment comparator 43 shown in FIG. 10 compares a local clock FCLK output from a delay line in a precise-adjustment delay circuit 42 with a signal DS subjected to frequency division by a frequency divider 47. In the case of this circuit, when the local clock FCLK rises, if the signal DS has already risen, that is, if the local clock FCLK is lagging behind the signal DS, outputs RA and RB go high alternately. If the signal DS rises in a first given time or longer after the local clock FCLK rises, that is, if the local clock FCLK is leading the signal DS by a phase difference that is equal to or larger than a first given magnitude, outputs RC and RD go high alternately. If the signal DS rises within the first given time after the local clock FCLK rises, that is, if the local clock FCLK is leading the signal DS by a phase difference that is smaller than the first given magnitude, outputs RA, RB, RC, and RD all go low. As illustrated, the signal DS is input to two flip-flops constituting an input unit and each including a NAND gate as it is. The local clock FCLK is input to one flip-flop in a delay introduced by an NAND gate and inverter. The magnitude of delay introduced by the NAND gate and inverter defines the first given magnitude. Signals indicating the result of judgment made by each coarse-adjustment comparator 43 are applied as signals A, B, C, and D to a delay control circuit, which is shown in FIG. 7, included in a coarse-adjustment DLL.

Figure 11:
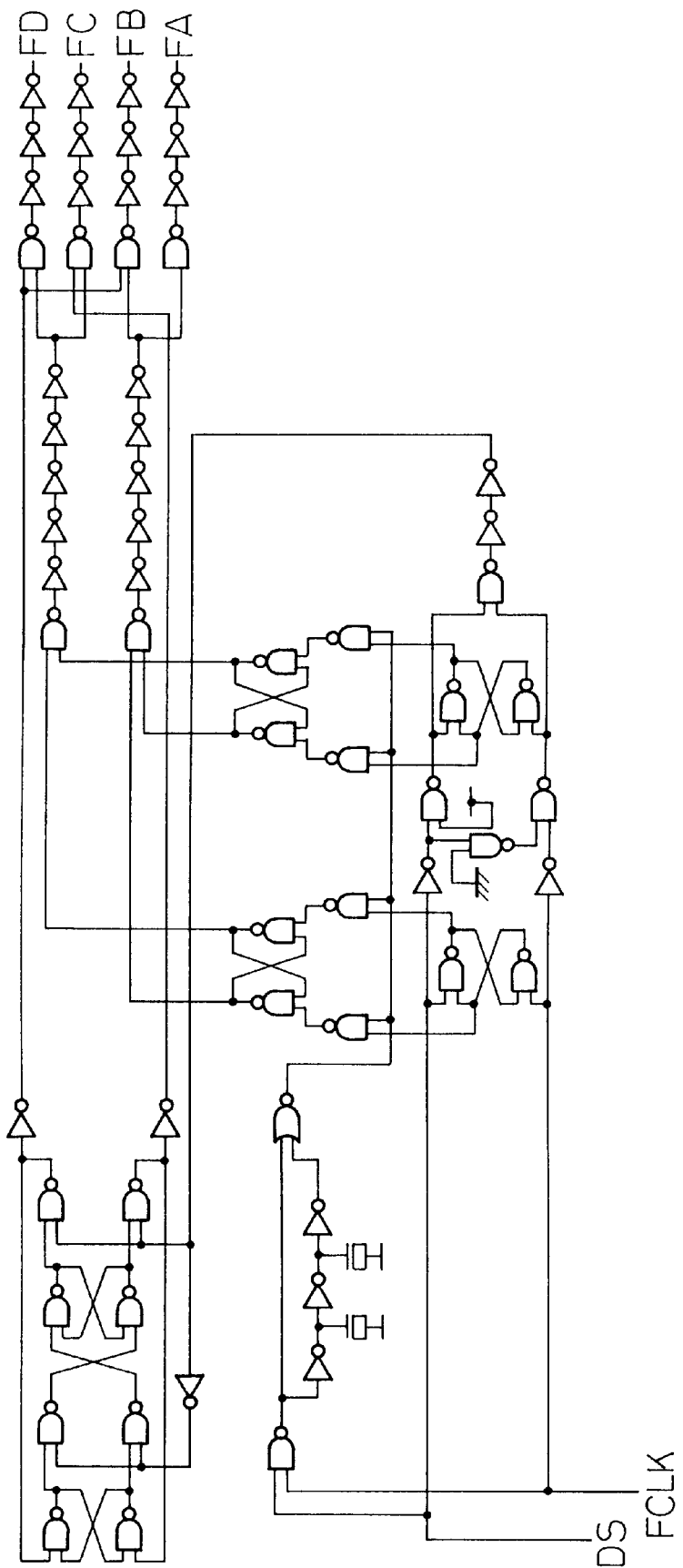
FIG. 11 is a diagram showing a precise-adjustment comparator in the first embodiment.

A precise-adjustment comparator 44 shown in FIG. 11 has nearly the same configuration as a coarse-adjustment comparator 43 shown in FIG. 10. However, the signal DS and local clock FCLK are delayed by a NAND gate and inverter and input to one flip-flop in an input unit. Moreover, since there is a difference in the number of gates to be driven by an inverter, a difference of a second magnitude of delay defining a state in which outputs FA, FB, FC, and FD are all low gets smaller. Even when it is judged by the coarse-adjustment comparator 43 shown in FIG. 10 that a phase difference between the DS and local clock FCLK falls below a given range of magnitudes, precise comparison is carried out in order to judge whether the local clock FCLK is leading or lagging behind the signal DS, or whether the phase difference falls below a second given magnitude. The result of judgment is then output. Similarly, signals indicating the result of judgment made by each precise-adjustment comparator 44 is applied as signals A, B, C, and D to a delay control circuit, which is shown in FIG. 7, included in a precise-adjustment DLL.

A frequency divider 47 shown in FIG. 12 divides the frequency of an input signal by eight. The necessity of dividing the frequency of an input signal will be described. A semiconductor device is requested to operate within a given range of clock frequencies. The aforesaid DLLs are therefore requested to operate within the range of clock frequencies. When a clock has a very high frequency, an output of each gate makes a transition to another state while having not made a full transition to one state. The result of comparison has therefore a difference between when the clock frequency is high and low. This poses a problem that desired phasing cannot be achieved. For solving this kind of problem, the frequency of an input signal is divided in order to extend a cycle of phase comparison or a cycle of feedback control based on the result of judgment. An input unit of a frequency divider 47 includes an NAND gate that inputs an input signal S and a Halt signal. When the Halt signal is driven low, input of the input signal S to the frequency divider 47 can be halted. Thus, the output of the frequency divider 47 is fixed, phase comparison is halted, and the control values in an associated delay control circuit are maintained.

The input latches 45 and re-synchronization latches 46 in FIG. 5 are latches that have been widely adopted in the past. The description of the latches will be omitted.

As described above, according to the first embodiment, internal clocks CLK output from the local clock buffers 39 are adjusted in phase in order to provide local clocks FCLK whose relative phases in relation to input signals are optimal. The local clocks FCLK are supplied to the input latches 45 in order to fetch the input signals into a chip according to optimal timing. However, the thus fetched input signals are different in phase. The re-synchronization latches 46 synchronize the input signals with the internal clocks CLK.

In the aforesaid circuit of the first embodiment, a time is required for stabilizing the control values in a delay control circuit. A given time required after the power supply is turned on is regarded as a calibration period to be spent on phase adjustment. Phase adjustment must therefore be completed within the calibration period. A time required for completing phase adjustment varies depending on an initial phase difference. The calibration period is set to the time required for completing phase adjustment irrespective of the initial phase difference. For phase adjustment, a clock and input signals must make a state transition. During the calibration period, a driving-side LSI chip must output a signal causing input signals to make a state transition at intervals of a given cycle.

In a normal operation, a clock makes a state transition at intervals of a certain cycle. Input signals do not make a state transition on a constant basis but may remain intact for a prolonged period of time. In this case, phase comparison cannot be carried out. In the circuit of the first embodiment, when input signals make no state transition, a result of phase judgment indicating that a previous state should be retained is output. Feedback control is therefore available even during the normal operation. In general, in a semiconductor device, the characteristic of a signal concerning a state transition varies depending on temperature. If the circuit of the first embodiment keeps operating during the normal operation, control is given so that input signals can be fetched according to optimal timing all the time.

Figure 13:
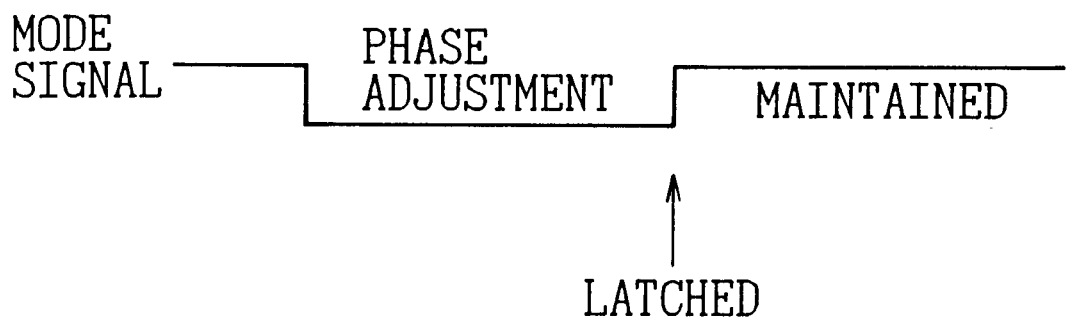
FIG. 13 is a diagram showing an operation mode in the first embodiment.

However, part of input signals may make a state transition and feedback control may therefore be given. The other input signals may not make a state transition and feedback control may therefore not be given. In this case, the part of the input signals are controlled to be input according to optimal timing, while the other input signals are input according to timing greatly deviated from the optimal input timing. Since this is unpreferable, a calibration period may be set periodically. In this case, as shown in FIG. 13, phase adjustment is carried out during the calibration period alone. After the calibration period is completed, the control signals produced by the delay control circuits in the coarse-adjustment delay circuit 41 and precise-adjustment delay circuits 42 are maintained.

In the first embodiment, the coarse-adjustment delay circuit 41 has the delay line thereof used in common and includes a plurality of transfer gates for selecting outputs of stages of the delay line. Thus, a coarsely-delayed clock associated with each input signal can be fetched. Phase adjustment of an internal clock relative to each input signal can be carried out independently over a whole range of the clock to be adjusted. However, since the same number of transfer gates as the number of input signals are included to be associated with the stages of the delay line, the problem of a large circuit scale remains unsolved. As mentioned above, generally, the internal clock CLK and group of input signals have a skew, which is larger than a skew between input signals, between them because of a difference between signal paths. In the second embodiment, therefore, the skew between the internal clock CLK and group of input signals is adjusted by a first DLL, and the skew between input signals is adjusted by a second DLL.

Figure 14:
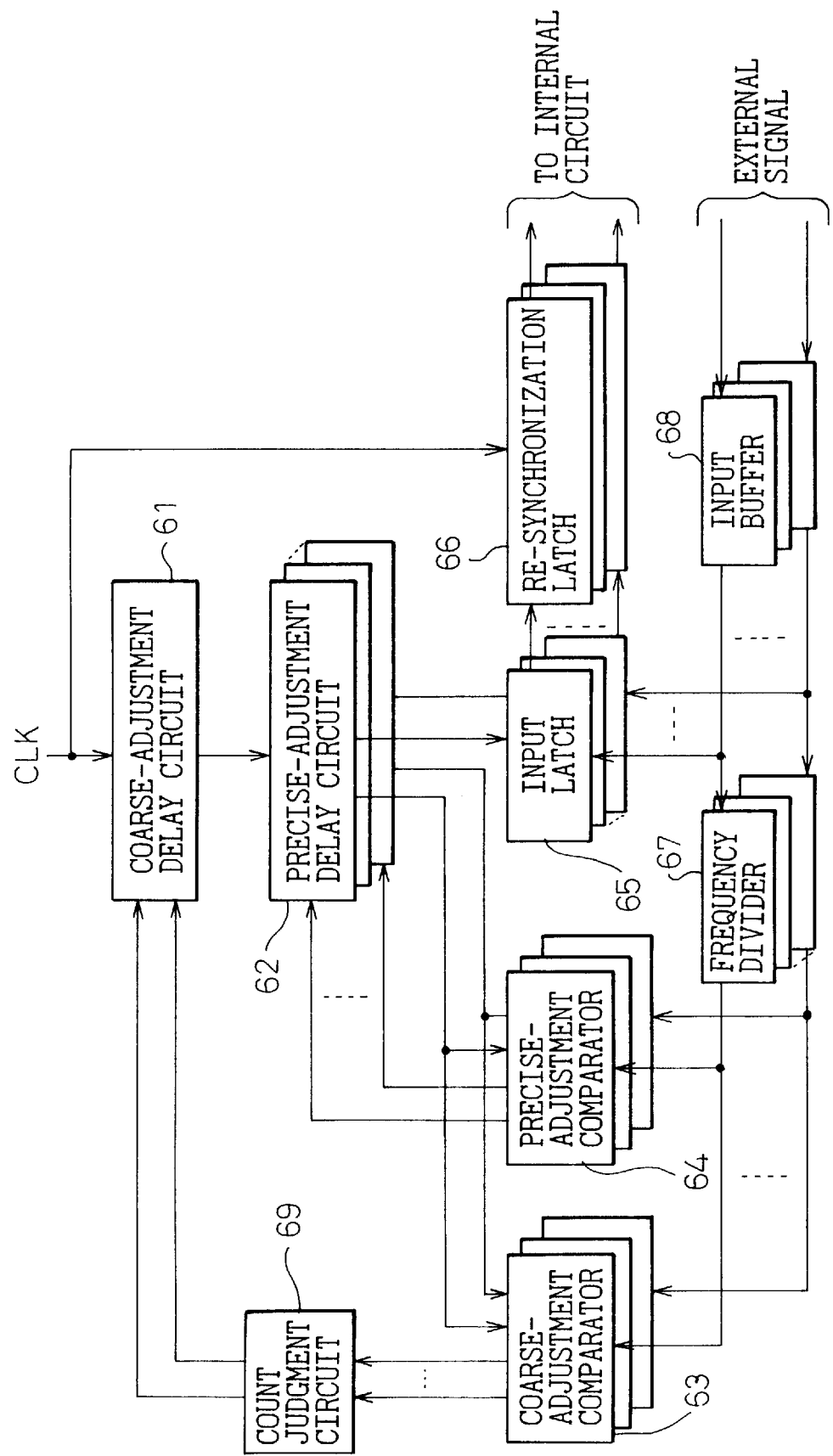
FIG. 14 is a block diagram showing the configuration of a time difference correction input circuit in the second embodiment.

FIG. 14 is a block diagram showing the configuration of a time difference correction circuit in the second embodiment. As illustrated, the time difference correction circuit in the second embodiment has nearly the same configuration as a time difference correction circuit in the first embodiment. A difference lies in a point that a count judgment circuit 69 is newly included and in the configuration of a delay line in a coarse-adjustment delay circuit 61. These components will be described below.

Figure 15:
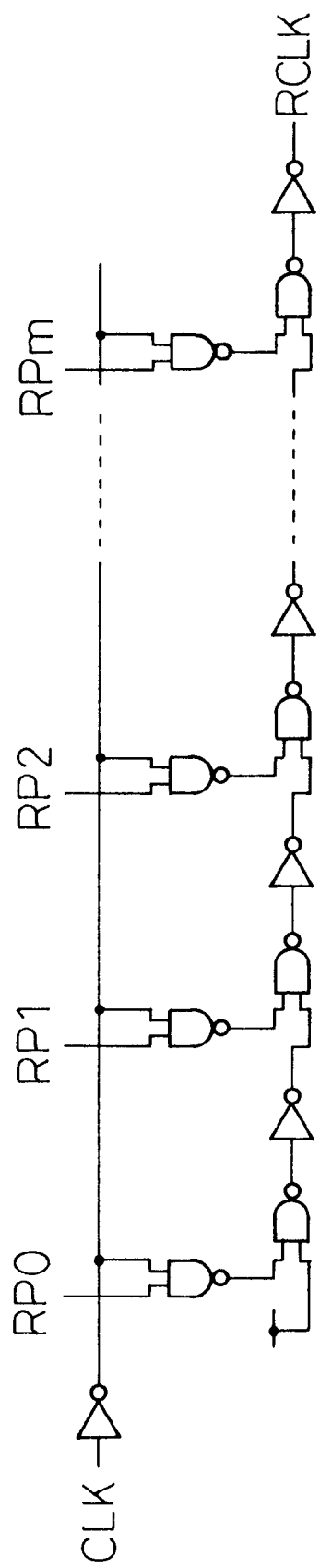
FIG. 15 is a diagram showing a delay line in a coarse-adjustment DLL in the second embodiment.

FIG. 15 is a diagram showing the configuration of the delay line in the coarse-adjustment delay circuit 61 in the second embodiment. As illustrated, numerous delay elements grouped into stages each composed of a NAND gate and inverter are connected in series with one another. A coarsely-delayed clock RCLK is fetched from the last stage. It is controlled with output signals RP0, etc., and RPm of a delay control circuit to which stage an internal clock CLK is input. The magnitude of delay varies depending on to which stage the internal clock CLK is input. The coarse-adjustment delay circuit 61 in the second embodiment therefore outputs only one coarsely-delayed clock RCLK that is supplied to precise-adjustment delay circuits 62.

Figure 16:
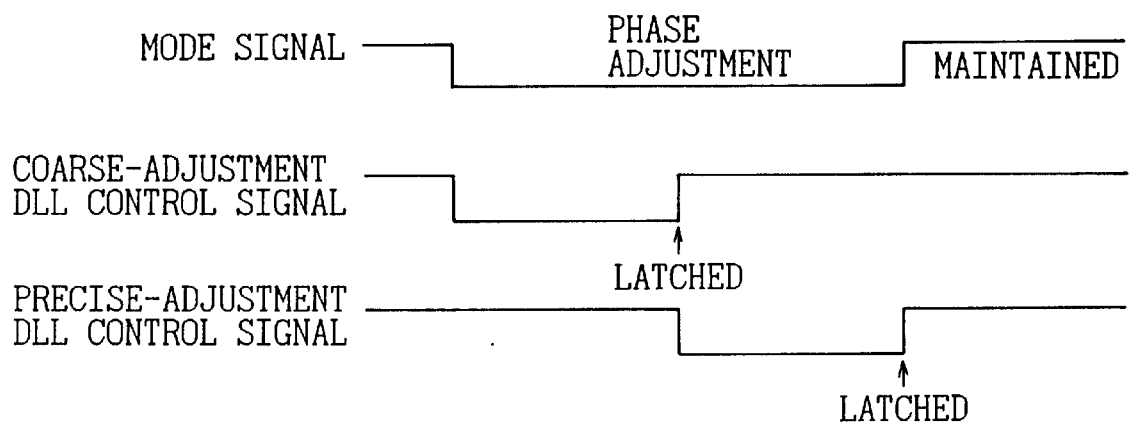
FIG. 16 is a diagram showing an operation mode in the second embodiment.

For this adjustment, in the second embodiment, as shown in FIG. 16, a calibration period during which phase adjustment is carried out is divided into two periods. During a first half period, a coarse-adjustment DLL is used for adjustment. During a second half period, precise-adjustment DLLs are used for adjustment. During the first half period during which the coarse-adjustment DLL is used for adjustment, the precise-adjustment DLLs do not give feedback control. The magnitude of delay introduced by a delay line in each precise-adjustment delay circuit is retained at an initial value. After adjustment by the coarse-adjustment DLL is completed, control signals produced by a delay control circuit in the coarse-adjustment delay circuit 61 are maintained. As soon as the adjustment by the coarse-adjustment DLL is completed, adjustment by the precise-adjustment DLLs is started. After the adjustment by the precise-adjustment DLLs is completed, control signals produced by delay control circuits in the precise-adjustment delay circuits 62 are maintained. As mentioned above, the precise-adjustment DLLs can give feedback control even during a normal operation. The precise-adjustment DLLs alone may carry out adjustment even during the normal operation.

The magnitude of delay introduced by the coarse-adjustment delay circuit 61 is adjusted so that the middle points of a plurality of input signals and a clock will be in phase. As shown in FIG. 14, the same number of coarse-adjustment comparators 63 as the number of input signals are included. The results of judgment made by the coarse-adjustment comparators 63 are input to the count judgment circuit 69. The count judgment circuit 69 accumulates the results of judgment made by the coarse-adjustment comparators 63. The count judgment circuit 69 outputs a result of judgment indicating that if the number of coarse-adjustment comparators 63 having judged that a local clock FCLK is lagging behind a signal DS is larger than the number of coarse comparators having judged that the local clock FCLK is leading, the magnitude of delay to be introduced by the delay line should be increased, and that if the number of coarse-adjustment comparators 63 having judged that the local clock FCLK is leading the signal DS is larger than the number of coarse-adjustment comparators having judged that the local clock FCLK is lagging, the magnitude of delay to be introduced by the delay line should be reduced. If the phase differences of the local clock FCLK from all signals DS fall below a given phase difference or if a difference between the number of coarse-adjustment comparators 63 having judged that the local clock FCLK is leading and the number of coarse-adjustment comparators having judged that the local clock FCLK is lagging is less than 1, the count judgment circuit 69 maintains the result of judgment.

In a variant of the second embodiment, a coarse-adjustment comparator 63 is included to be associated with one typical input signal, and the result of judgment made by the coarse-adjustment comparator is supplied to the coarse-adjustment delay circuit 61. In this case, the count judgment circuit 69 is unnecessary. This leads to a great reduction in circuit scale.

Figure 17:
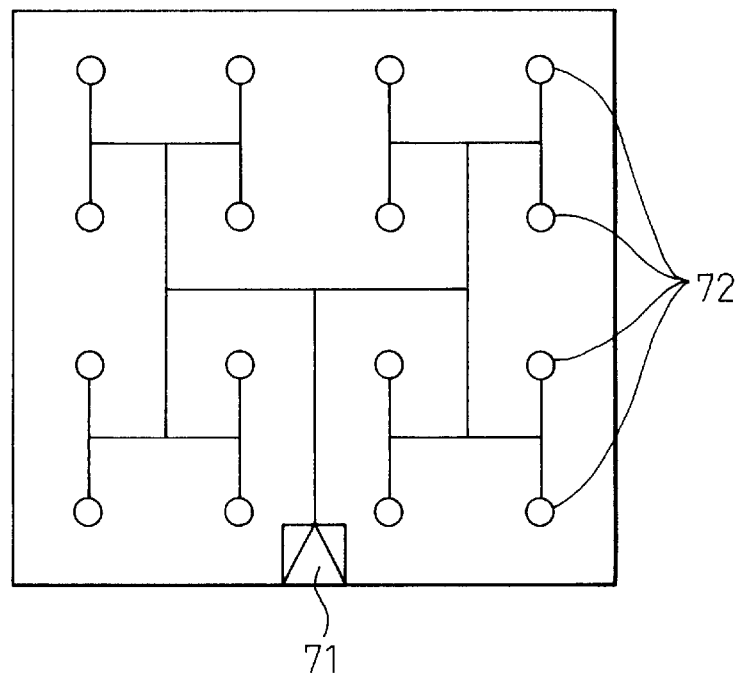
FIG. 17 is a diagram showing an H-shaped tree type clock distribution circuit.

In the second embodiment, the circuit disclosed in the Japanese Patent Application No. 9-83050 is adopted as a clock distribution circuit. Instead of the circuit, an H-shaped tree type clock distribution circuit may be employed. FIG. 17 is a diagram showing the basic configuration of the H-shaped tree type clock distribution circuit. An internal clock output from a clock driver 71 is transferred to clock buffers 72 located at terminals along the paths shown in FIG. 17. The lengths of the signal paths leading to the clock buffers and the loads on the signal paths are designed to be mutually identical. Internal clocks reaching the clock buffers 72 are therefore in phase.

Figure 18:
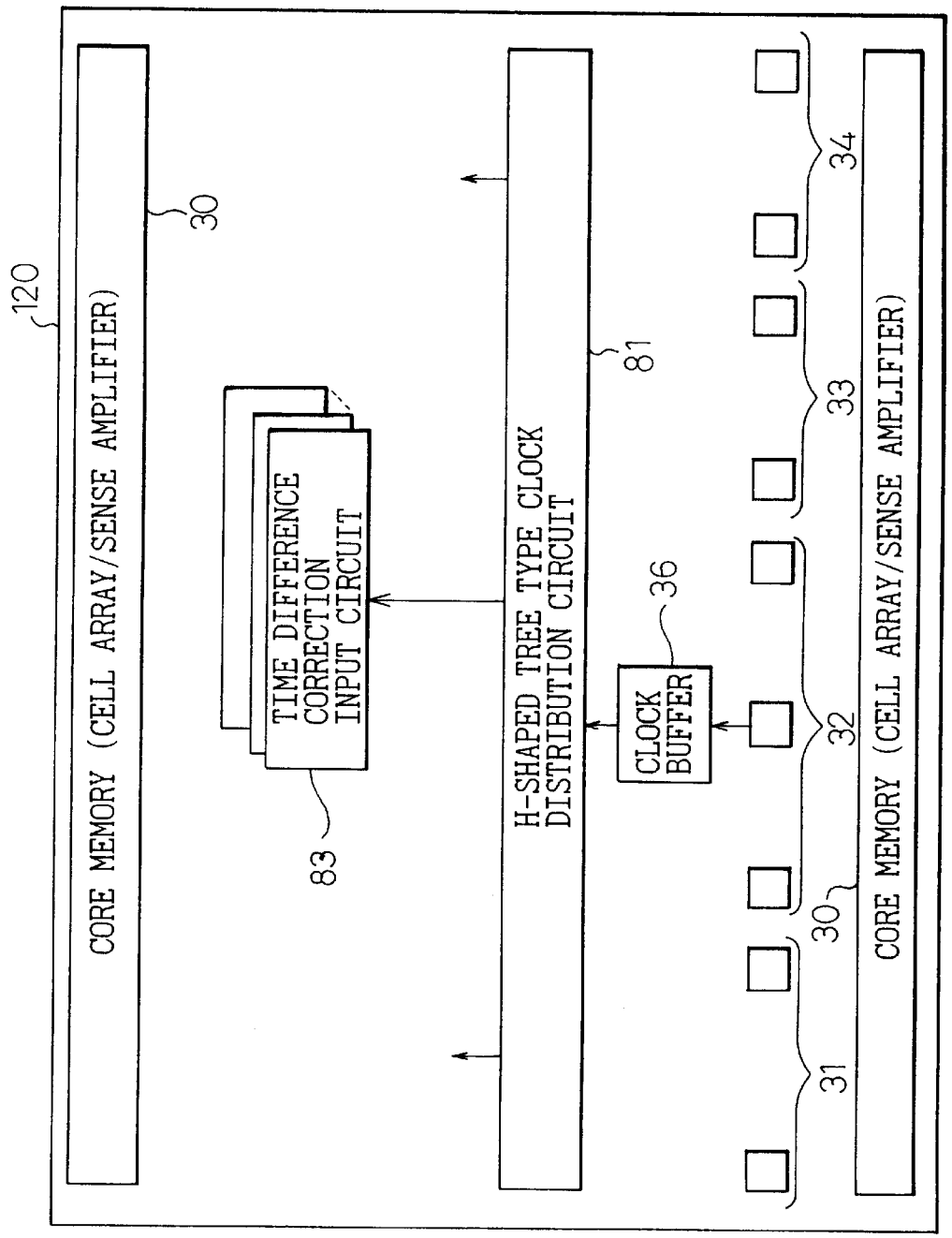
FIG. 18 is a diagram showing the overall configuration of a synchronous DRAM of the third embodiment.

FIG. 18 is a diagram showing the overall configuration of an SDRAM of the third embodiment. The SDRAM is identical to that of the first embodiment except a point that an H-shaped tree type clock distribution circuit is substituted for the clock distribution circuit disclosed in the Japanese Patent Application No. 9-83050. The further description will therefore be omitted.

The embodiments in which the present invention is adapted to a unit for fetching input signals within an SDRAM have been described so far. The present invention is not limited to this working mode. The present invention can apply to a working mode in which the output timing of a plurality of output signals of an SDRAM is adjusted precisely or to an LSI chip other than an SDRAM. Moreover, the embodiments have been described on the assumption that two steps of coarse adjustment and precise adjustment are carried out. Alternatively, adjustment may be carried out in three or more steps.

As described so far, according to the present invention, when one clock is used to produce clocks precisely adjusted in units of a very small magnitude, even if the same adjustment unit is adopted, a circuit scale can be reduced, and a compact and low-cost chip can be realized.

What is claimed is:

1. A clock generator for generating a plurality of clocks adjusted in phase for a plurality of objects in response to a received clock, comprising:

a first DLL for adjusting a phase of the received clock by delaying the received clock and outputting a coarsely-adjusted clock; and a plurality of second DLLs, associated with the plurality of objects, for adjusting a phase of the coarsely-adjusted clock by delaying the coarsely-adjusted clock and outputting the plurality of clocks, wherein said first DLL judges whether a phase difference between a phase of one of the plurality of clocks and a predetermined optimal phase value is within a predetermined range of phase differences; and if the phase difference does not fall within the predetermined range of phase differences, said first DLL judges whether the clock is leading or lagging, and changes a magnitude of delay of one of the plurality of clocks in response to the judgement; and wherein said second DLLs judge whether the plurality of clocks are leading or lagging with respect to the predetermined optimal phase value, and change magnitudes of delay of one of the plurality of clocks in response to the results of the judgement.

2. A clock generator according to claim 1, wherein the magnitude of delay introduced in one stage of said first DLL is larger than the magnitude of delay introduced in one stages of said plurality of second DLLs.

3. A clock generator according to claim 1, wherein said first DLL can output a plurality of coarsely-adjusted clocks whose magnitudes of delay are adjusted independently, judges whether or not the phase differences of all the plurality of clocks from an optimal clock fall within the given range of phase differences; and if the phase differences do not fall within the given range of phase differences, the first DLL judges whether or not the clocks are leading or lagging, and outputs coarsely-adjusted clocks whose magnitudes of delay are adjusted independently on the basis of the results of judgment to said second DLLs.

4. A clock generator according to claim 2, wherein said first DLL can output a plurality of coarsely-adjusted clocks whose magnitudes of delay are adjusted independently, and judges whether or not the phase differences between all the plurality of clocks and the optimal phase value fall within the given range of phase differences; and if the phase differences do not fall within the given range of phase differences, the first DLL judges whether or not the clocks are leading or lagging, and outputs coarsely-adjusted clocks whose magnitudes of delay are adjusted independently on the basis of the results of judgment to said second DLLS.

5. A clock generator according to claim 3, wherein said first DLL includes a delay circuit for delaying the received clock stepwise, and a row of switches for supplying or not supplying the outputs of the stages of said delay circuit to said second DLLs, wherein a switch to be brought to conduction is selected from said row of switches on the basis of the results of judgment made on all the plurality of clocks.

6. A clock generator according to claim 4, wherein said first DLL includes a delay circuit for delaying the received clock stepwise and a row of switches for supplying or not supplying the outputs of the stages of said delay circuit to said second DLLs, wherein a switch to be brought to conduction is selected from said row of switches on the basis of the results of judgment made on all the plurality of clocks.

7. A clock generator according to claim 1, wherein said first DLL and second DLLs each include a latch function for holding an adjusted magnitude of delay.

8. A semiconductor device, comprising:
  a clock distribution circuit for distributing an internal clock generated on the basis of an externally input received clock; and
  local clock generators for generating a plurality of local clocks generated on the basis of the internal clock supplied from said clock distribution circuit,
  wherein each of said local clock generators comprises:
    a first DLL for adjusting a phase of the internal clock by adjusting a magnitude of delay, by which the internal clock is delayed, stepwise, and outputting a coarsely-adjusted clock; and
    a plurality of second DLLs for adjusting a phase of the coarsely-adjusted clock by adjusting the magnitude of delay, by which the coarsely-adjusted clock is delayed, stepwise, and outputting the plurality of local clocks,
  wherein said first DLL judges whether a phase difference between a phase of at least one of the plurality of local clocks and a predetermined optimal clock phase falls within a given range of phase differences; and if the phase difference does not fall within the given range of phase differences, said first DLL judges whether the local clock is leading or lagging with respect to the optimal clock phase and changes the magnitude of phase adjustment of one of the plurality of local clocks on the basis of the result of judgement; and
  wherein said second DLLs judge whether the plurality of clocks are leading or lagging with respect to the optimal clock phase, and change magnitudes of phase adjustment of one of the plurality of local clocks on the basis of the result of the judgement.

9. A semiconductor device according to claim 8, wherein said first DLL can output a plurality of coarsely-adjusted clocks whose magnitudes of delay are adjusted independently, and judges whether or not the phase differences of all the plurality of clocks from the optimal clock phase fall within the given range of phase differences; and if the phase differences do not fall within the given range of phase differences, said first DLL judges whether the plurality of clocks are leading or lagging, and outputs the coarsely-adjusted clocks whose magnitudes of delay are adjusted independently on the basis of the results of judgment to said second DLLS.

10. A semiconductor device according to claim 8, wherein said semiconductor device fetches input data items synchronously with the edges of the plurality of local clocks.

11. A semiconductor device according to claim 10, further comprising re-synchronization circuits for re-synchronizing the input data items fetched synchronously with the edges of the plurality of local clocks with a common re-synchronization clock.

12. A semiconductor device according to claim 8, wherein said clock distribution circuit has an H-shaped tree type wiring in which the lengths of lines leading to distribution destinations of the internal clock and the loads thereon are identical.

13. A semiconductor device according to claim 8, wherein said clock distribution circuit includes incoming and outgoing lines over which the internal clock is transferred to go out and back, and local clock buffers, located along said incoming and outgoing lines, for receiving incoming and outgoing internal clocks and generating corrected internal clocks that are in phase with the middle points of the incoming and outgoing internal clocks.

14. A semiconductor device according to claim 8, wherein the magnitude of delay introduced in one stage of said first DLL is larger than the magnitude of delay introduced in any one stage of said plurality of second DLLs.

15. A semiconductor device according to claim 9, wherein said first DLL includes a delay circuit for delaying the received clock stepwise, and a row of switches for supplying or not supplying the outputs of the stages of said delay circuit to said second DLLs, wherein a switch to be brought to conduction is selected from said row of switches on the basis of the results of judgment made on all of the plurality of clocks.

16. A semiconductor device according to claim 8, wherein said first DLL and second DLLs each include a latch for holding an adjusted magnitude of delay.

17. A semiconductor device according to claim 16, wherein said semiconductor device can operate in a calibration mode in which the magnitudes of delay to be introduced by said first and second DLLs are adjusted; after the calibration mode is completed, said first and second DLLs maintain the magnitudes of delay set at the completion of the calibration mode.

18. A semiconductor device, comprising:
  a first latch circuit receiving a first input signal in response to a first internal clock;
  a second latch circuit receiving a second input signal in response to a second internal clock;
  a clock buffer circuit receiving an external clock, and outputting said first and second internal clocks; the clock buffer circuit including a main DLL circuit receiving said external clock having a coarse accuracy, and outputting a reference clock;
  a first sub DLL circuit receiving the reference clock, associated with said first latch circuit, having a fine accuracy, and outputting said first internal clock;
  a second sub DLL circuit receiving the reference clock, associated with said second latch circuit, having the fine accuracy, and outputting said second internal clock.

* * * * *